(12) United States Patent
Singh

(10) Patent No.: US 6,449,086 B1
(45) Date of Patent: Sep. 10, 2002

(54) MULTILAYER EXTREME ULTRAVIOLET MIRRORS WITH ENHANCED REFLECTIVITY

(75) Inventor: Mandeep Singh, Twickenham (GB)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 09/605,651

(22) Filed: Jun. 28, 2000

(30) Foreign Application Priority Data

Jul. 2, 1999 (EP) .............................................. 99305283
Oct. 7, 1999 (EP) .............................................. 99307932

(51) Int. Cl.[7] ................................................. F21V 9/06
(52) U.S. Cl. ........................ 359/361; 359/359; 359/360; 359/585; 378/84; 428/141
(58) Field of Search ................................ 359/350, 359, 359/360, 585; 428/141, 67; 373/84, 95

(56) References Cited

U.S. PATENT DOCUMENTS

| | | | | |
|---|---|---|---|---|
| 4,778,251 A | * | 10/1988 | Hall et al. .................... | 359/586 |
| 5,360,659 A | * | 11/1994 | Arends et al. ............... | 359/359 |
| 5,433,988 A | * | 7/1995 | Fukuda et al. ............... | 426/141 |
| 5,513,039 A | * | 4/1996 | Lu et al. ...................... | 359/359 |
| 5,591,529 A | * | 1/1997 | Braatz et al. ................ | 359/359 |
| 5,850,309 A | * | 12/1998 | Shirai et al. ................. | 359/360 |
| 6,160,867 A | * | 12/2000 | Murakami .................... | 378/34 |
| 6,229,652 B1 | * | 5/2001 | Bajt et al. .................... | 359/359 |

* cited by examiner

*Primary Examiner*—Cassandra Spyrou
*Assistant Examiner*—Fayez Assaf
(74) *Attorney, Agent, or Firm*—Pillsbury Winthrop LLP

(57) ABSTRACT

The reflectivity of multilayered EUV mirrors tuned for 11–16 nm, for which the two-component Mo/Be and Mo/Si multilayered systems are commonly used, is enhanced by incorporating additional elements and their compounds mainly from period 5 of the periodic table. In addition, the reflectivity performance of the multilayer stacks is further enhanced by a numerical global optimization procedure by which the layer thicknesses are varied for optimum performance in, contradistinction to the constant layer thickness—i.e. constant partition ration—multilayer stacks commonly designed and fabricated hitherto. By incorporating additional materials with differing complex refractive indices in various regions of the stack, or by wholly replacing one of the components (typically Mo), peak reflectivity enhancements of up to 5% for a single reflector are achieved, compared to a standard unoptimized stack. The additional materials used are: Rb, RbCl, Sr, Y, Zr, Ru, Rh, Tc, Pd, Nb and Be. Protective capping layers of B, Ru, Rh, C, Si3N4, SiC, are disclosed.

22 Claims, 6 Drawing Sheets

MULTILAYER EXTREME ULTRAVIOLET MIRRORS WITH ENHANCED REFLECTIVITY

BACKGROUND OF THE INVENTION

The present invention relates to multilayer mirrors for extreme ultraviolet radiation. More particularly, the invention relates to the use of such mirrors in lithographic projection apparatus comprising:

an illumination system for supplying a projection beam of radiation;

a first object table provided with a mask holder for holding a mask;

a second object table provided with a substrate holder for holding a substrate; and a projection system for imaging an irradiated portion of the mask onto a target portion of the substrate.

DESCRIPTION OF THE RELATED ART

For the sake of simplicity, the projection system may hereinafter be referred to as the "lens"; however, this term should be broadly interpreted as encompassing various types of projection system, including refractive optics, reflective optics, catadioptric systems, and charged particle optics, for example. The illumination system may also include elements operating according to any of these principles for directing, shaping or controlling the projection beam, and such elements may also be referred to below, collectively or singularly, as a "lens". In addition, the first and second object tables may be referred to as the "mask table" and the "substrate table", respectively.

In the present document, the invention is described using a reference system of orthogonal X, Y and Z directions and rotation about an axis parallel to the I direction is denoted Ri. Further, unless the context otherwise requires, the term "vertical" (Z) used herein is intended to refer to the direction normal to the substrate or mask surface or parallel to the optical axis of an optical system, rather than implying any particular orientation of the apparatus. Similarly, the term "horizontal" refers to a direction parallel to the substrate or mask surface or perpendicular to the optical axis, and thus normal to the "vertical" direction.

Lithographic projection apparatus can be used, for example, in the manufacture of integrated circuits (ICs). In such a case, the mask (reticle) may contain a circuit pattern corresponding to an individual layer of the IC, and this pattern can be imaged onto an exposure area (die) on a substrate (silicon wafer) which has been coated with a layer of photosensitive material (resist). In general, a single wafer will contain a whole network of adjacent dies which are successively irradiated via the reticle, one at a time. In one type of lithographic projection apparatus, each die is irradiated by exposing the entire reticle pattern onto the die at once such an apparatus is commonly referred to as a wafer stepper. In an alternative apparatus—which is commonly referred to as a step-and-scan apparatus—each die is irradiated by progressively scanning the reticle pattern under the projection beam in a given reference direction (the "scanning" direction) while synchronously scanning the wafer table parallel or anti-parallel to this direction; since, in general, the projection system will have a magnification factor M (generally <1), the speed V at which the wafer table is scanned will be a factor M times that at which the reticle table is scanned. More information with regard to lithographic devices as here described can be gleaned from International Patent Application WO97/33205, for example.

Until very recently, lithographic apparatus contained a single mask table and a single substrate table. However, machines are now becoming available in which there are at least two independently moveable substrate tables; see, for example, the multi-stage apparatus described in International Patent Applications WO98/28665 and WO98/40791. The basic operating principle behind such multi-stage apparatus is that, while a first substrate table is at the exposure position underneath the projection system for exposure of a first substrate located on that table, a second substrate table can run to a loading position, discharge a previously exposed substrate, pick up a new substrate, perform some initial measurements on the new substrate and then stand ready to transfer the new substrate to the exposure position underneath the projection system as soon as exposure of the first substrate is completed; the cycle then repeats. In this manner it is possible to increase substantially the machine throughput, which in turn improves the cost of ownership of the machine. It should be understood that the same principle could be used with just one substrate table which is moved between exposure and measurement positions.

In a lithographic apparatus the size of features that can be imaged onto the wafer is limited by the wavelength of the projection radiation. To produce integrated circuits with a higher density of devices, and hence higher operating speeds, it is desirable to be able to image smaller features. While most current lithographic projection apparatus employ ultraviolet light generated by mercury lamps or excimer lasers, it has been proposed to use shorter wavelength radiation of around 13nm. Such radiation is termed extreme ultraviolet (EUV) or soft x-ray and possible sources include laser plasma sources or synchrotron radiation from electron storage rings. An outline design of a lithographic projection apparatus using synchrotron radiation is described in "Synchrotron radiation sources and condensers for projection x-ray lithography", J B Murphy et al, Applied Optics Vol. 32 No. 24 pp 6920–6929 (1993).

In the EUV spectral region high reflectivity mirrors, apart from grazing incidence mirrors, must necessarily be multi-layered thin film designs. The predominant designs are composed of distrbuted Bragg reflectors resembling quarter wavelength stacks with constant film thicknesses throughout. For the 11–16 nm wavelength region two designs predominate: Mo/Be for the 11.3 nm window consisting typically of 80 periods and the Mo/Si system for the 13.4 nm window of 40–50 periods, both with a partition ratio $\Gamma=0.4$, where $\Gamma=d_{Mo}/(d_{Mo}+d_{Si(Be)})$. In general, the partition ratio is defined as the ratio of the thickness of the material having the higher extinction coefficient, k, to the total thickness of the two layers. These designs yield maximum theoretical reflectivities of R~0.78 for the Mo/Be stack, and R~0.74 for the Mo/Si stack while taking into account a highly absorbing ~2 nm native oxide on the surface Si layer. These reflectivity values (which are amongst the best for multilayer reflectors in the EUV region), while insert adequate for optical systems with a few reflectors, will dramatically diminish the output optical intensity to 6–10% of that directly before the first mirror in, for example, a nine-mirror system. The significance of nine mirrors is that this is the number envisaged for an EUV lithographic system; two in the illumination optics, six in the imaging optics plus the reflecting reticle. It is therefore evident that even a "small" increase of 1–2% in the peak reflectivity of a single mirror will yield a significant light throughput enhancement of the optical system.

It is an object of the present invention to provide multilayer mirrors for extreme ultraviolet radiation (EUV) that have higher reflectivities at desired wavelengths.

SUMMARY OF THE INVENTION

According to the present invention, this and other objects are achieved in a reflector for reflecting radiation in a desired wavelength range, the reflector including a stack of alternating layers of a first and a second material, said first material having a lower real refractive index in said desired wavelength range than said second material, characterised by:

at least one layer of a third material interposed in said stack, said third material being selected from the group comprising Rb, RbCl, RbBr, Sr, Y, Zr, Ru, Rh, Tc, Pd, Nb and Be as well as alloys and compounds of such materials.

In preferred embodiments of the invention, a layer of said third material is interposed between each pair of layers of said first and second materials, and optionally at least one layer of a fourth material may be interposed in said stack, said fourth material being selected from the group comprising Rb, RbCl, RbBr, Sr, Y, Zr, Ru, Rh, Tc, Pd, Nb and Be as well as alloys and compounds of such materials.

The present invention also provides a reflector for reflecting radiation in a desired wavelength range, the reflector comprising a stack of alternating layers of a first and a second material, said first material having a lower real refractive index in said desired wavelength range than said second material, characterised in that:

the layer thicknesses of said first and second materials vary through the stack.

The layer thicknesses are preferably determined by a global or needle optimisation technique.

The invention further provides a reflector for reflecting radiation in a desired wavelength range, the reflector comprising a stack of alternating layers of a first and a second material, said first material having a lower real refractive index in said desired wavelength range than said second material, characterised in that: said second material is selected from the group comprising P, Sr, Rb and the lanthanides, especially La, Ce, Pr and Eu, as well as compounds or alloys thereof.

Still further, the present invention provides a reflector for reflecting radiation in a desired wavelength range, the reflector comprising a stack of alternating layers of a first and a second material, said first material having a lower real refractive index in said desired wavelength range than said second material, characterised in that:

said first material is selected from the group comprising Ru and Rh as well as alloys and compounds thereof.

Reflectors according to the invention may have a capping layer of a relatively inert material, which is preferably selected from the group comprising diamond-like carbon (C), silicon carbide (SiC), boron nitride (BN), silicon nitride ($Si_3N_4$), B, Ru and Rh and preferably has a thickness in the range of from 0.5 to 3 nm, preferably in the range of from 1 to 2 nm.

A second aspect of the invention provides a lithographic projection apparatus including:

an illumination system for supplying a projection beam of radiation;

a first object table provided with a mask holder for holding a mask;

a second object table provided with a substrate holder for holding a substrate; and a projection system for imaging an irradiated portion of the mask onto a target portion of the substrate; characterised in that:

at least one of said illumination system and said projection system includes a reflector as described above.

A third aspect of the invention provides a method of manufacturing a reflector for reflecting radiation in a desired wavelength, the reflector including a stack of alternating layers of a first and a second material, wherein the first material has a lower real refractive index than the second material, the method comprising the steps of:

determining appropriate layer thicknesses using a numerical iterative optimisation process; and manufacturing the reflector with layer thicknesses substantially as determined in the determining step.

In preferred embodiments of the third aspect of the invention, the iterative process comprises:

establishing a model of a reflector having specified materials for the first and second materials and specified initial thicknesses for the layers;

varying the thicknesses of one or more layers of the stack and calculating the reflectivity of the resultant stack; and repeating the varying and calculating steps until a specified criterion is reached.

Optionally in the establishing step, at least one layer of at least one third material is also included in the stack, the thickness of said layer of third material being varied in at least one iteration of the varying step.

With the invention, reflectivity enhancements in the standard Mo/Be and Mo/Si stacks can be achieved by one or more of:

(1) incorporating additional materials within the basic stack, (2) replacing one of the components of the standard stack by one with more favourable optical constants, (3) utilising global optimisation routines to vary the partition ratio or the individual film thicknesses within the stack for optimum peak reflectivity, and (4) selecting certain relatively inert materials as capping layers to avoid the formation of highly absorbing surface oxide films.

The various materials usable in the invention, in addition to molybdenum (Mo), silicon (Si) and beryllium (Be), are derived mainly from period 5 of the periodic table of elements and include: rubidium (Rb), rubidium chloride (RbCl), rubidium bromide (RbBr), strontium (Sr), yttrium (Y), zirconium (Zr), ruthenium (Ru), rhodium (Rh), palladium (Pd), technetium (Tc), phosphorous (P), boron (B) and niobium (Nb). Alloys and compounds of these materials may also be used.

Other materials usable in the present invention are the lanthanides, from lanthanum to lutetium, but especially: lanthanum (La), cerium (Ce), praseodymium (Pr), neodymium Nd), samarium (Sm) and europium (Eu). These and the other lanthanides mentioned above may be used with: phosphorous (P), niobium (Nb) and antimony (Sb).

In addition to the pure elements, compounds of the above materials may be used, especially the borides, carbides, nitrides, phosphides, halides (e.g. CsI). Alloys of the metals noted, and including the Group IIA elements, may also be employed in the invention.

Still further materials useable in the invention are low density porous materials such as silica, titania and alumina aerogels; nano-porous silicon, meso-porous silicon, nano-clusters of silicon and other semiconductors In embodiments of the invention, any or all of the layers may have other materials or elements implanted or diffused into them, e.g. to effect any desired alterations to their optical, chemical or mechanical properties.

With the invention it is possible to provide a reflector optimised to a particular radiation source, especially in the 8 to 16 nm wavelength range.

A fourth aspect of the invention provides a device manufacturing method including the steps of:

providing a substrate which is at least partially covered by a layer of energy-sensitive material;

providing a mask containing a pattern;

using a projection beam of radiation to project an image of at least part of the mask pattern onto a target area of the layer of energy-sensitive material; characterised in that:

said projection beam of radiation is supplied or projected using an illumnation or projection system including a reflector according to the first aspect of the invention.

In a manufacturing process using a lithographic projection apparatus according to the invention a pattern in a mask is imaged onto a substrate which is at least partially covered by a layer of energy-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping) metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target area", respectively.

BRIEF DESCRIPTION OF THE DRAWINGS

The present invention and its attendant advantages will be described below with reference to exemplary embodiments and the accompanying schematic drawings, in which.

In the various drawings, like parts are indicated by like references.

DETAILED DESCRIPTION

Embodiment 1

Figure 1:
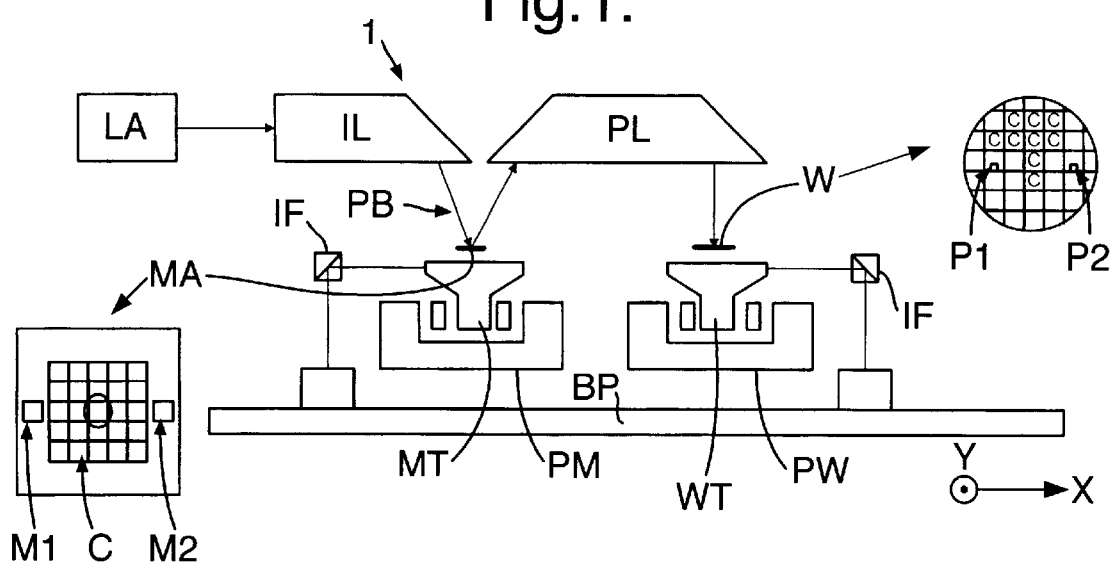
FIG. 1 depicts a lithographic projection apparatus according to the invention.

FIG. 1 schematically depicts a lithographic projection apparatus according to the invention. The apparatus includes:

a radiation system LA, IL for supplying a projection beam PB of EUV radiation;

a first object table (mask table) MT provided with a mask holder for holding a mask MA (e.g. a reticle), and connected to first positioning means PM for accurately positioning the mask with respect to item PL;

a second object table (substrate table) WT provided with a substrate holder for holding a substrate W (e.g. a resist-coated silicon wafer), and connected to second positioning means PW for accurately positioning the substrate with respect to item PL;

a projection system ("lens") PL (e.g. a refractive or catadioptric system or a reflective system) for imaging an irradiated portion of the mask MA onto a target portion C (die) of the substrate W.

The radiation system comprises a source LA (e.g. an undulator or wiggler provided around the path of an electron beam in a storage ring or synchrotron or a laser-induced plasma source) which produces a beam of radiation. This beam is passed along various optical components included in illumination system ("lens") IL so that the resultant beam PB is collected in such a way as to give uniform illumination at the entrance pupil and the mask.

The beam PB subsequently impinges upon the mask MA which is held in a mask holder on a mask table MT. Having been selectively reflected by the mask MA, the beam PB passes through the lens PL, which focuses the beam PB onto a target area C of the substrate W. With the aid of first positioning means PW and the interferometric displacement measuring means IF, the substrate table WT can be moved accurately, e.g. so as to position different target areas C in the path of the beam PB. Similarly, the positioning means PM can be used to accurately position the mask MA with respect to the path of the beam PB, e.g. after mechanical retrieval of the mask MA from a mask library. In general, movement of the object tables MT, WT will be realised with the aid of a long stroke module (course positioning) and a short stroke module (fine positioning), which are not explicitly depicted in FIG. 1.

The depicted apparatus can be used in two different modes:

In step mode, the mask table MT is kept essentially stationary, and an entire mask image is projected at once (i.e. a single "flash") onto a target area C. The substrate table WT is then shifted in the x and/or y directions so that a different target area C can be irradiated by the beam PB;

In scan mode, essentially the same scenario applies, except that a given target area C is not exposed in a single "flash". Instead, the mask table MT is movable in a given direction (the so-called "scan direction", e.g. the x direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target area C can be exposed, without having to compromise on resolution.

The illumination system IL may be constructed as described in copending European Patent Application 00300784.6 (applicant's ref P-0129), which is hereby incorporated by reference.

EXAMPLES

The examples of the invention described below are obtained from computations performed using the thin film design program TFCalc (Software Spectra Inc.) and verified using LPro (4D Technology Ltd.). The built-in global and needle optimisation routines of TFCalc were used for the optimisation process, as described in A. V. Tikhonravov, Appl. Opt. 32, 5417 (1993), A. V. Tikhonravov, M. K. Trubetskov and G M. DeBell, Appl. Opt. 35, 5493 (1996) and J. A. Dobrowski and R. A. Kemp, Appl. Opt. 29, 2876 (1990), which references are incorporated herein by reference. The optical constants of the various materials, namely the complex refractive index N=n-ik are derived from atomic scattering factors by Henke et. al. and were obtained from the CXRO web server at Berkeley (B. L. Henke, E. M. Gullikson, and J. C. Davis, Atomic Data and Nuclear Data Tables, 54(2), 181–342 (1993); http://www.cxro.lbl.gov/optical_constants/). The values of n and k for the materials used were downloaded as functions of wavelength from 6 nm to 42 nm and as such the wavelength dependence of n and k is implicit in all calculations. The values of n and k for various materials at some wavelengths of particular interest are tabulated in Table 1 below. To demonstrate the performance enhancement of the reflectors according to the invention, we assume ideal "white" light illumination in the examples below.

Comparative Example 1

Comparative Example 1 is a standard Si-based multilayer stack comprising an unoptimised 50-period Mo/Si system grown on a Zerodur (RTM) glass substrate, with a partition ratio Γ=0.4. yielding $d_{Mo}$=2.8 nm and $d_{Si}$=4.1 nm. In addition, it is assumed that the final Si layer will undergo oxidation and effectively form a ~2 nm layer of native oxide. Analysis of such a stack yields a peak reflectivity at ~13.4 nm of R=0.731. This stack provides the reference for performance comparisons of stacks according to the invention.

Examples 2 to 23

Examples 2 to 23 according to the invention consist of variations on the stack of reference example 1 as detailed in Table 2 below. In Table 2, column 2 gives the materials used in the layers of the stack; column 3 gives the optimisation applied: N indicates none, Y indicates global optimisation and Y(n) indicates needle optimisation (described further below); column 4 gives the capping layer applied; column 5 gives the peak reflectivity R; column 6 gives the $R^9$peak reflectivity in relative units and column 7 gives the $R^9$int (integrated) reflectivity in relative units.

For a 9-reflector system, a more useful measure of optical throughput is the value of $R^9$, which the net reflectivity of a series of nine reflectors. $R^9$int is the area under the curve in the $R^9$ vs. λ (wavelength) spectrum. The variation between $R^9$peak and $R^9$int for a given stack is an indication of the variation in the spectral half-width which is a function of the optimization process, or the incorporated materials, or the capping layer material, or any combination of the three.

The final surface layer of all of examples 2 to 20 is a 4.1–4.5 nm Si layer on which the capping layer specified in column 4 is deposited, or grown in the case of SiO. Growing the $SiO_2$ consumes the surface Si layer so that in the case of Example 2 the top two layers are 2 nm of Si, the remains of the approximately 4 nm Si layer prior to oxidation and which may be regarded as the final layer of the multilayer, and 2 nm SiO2. Examples 21 to 23 are terminated with a 4.0 to 4.4 nm Rb layer upon which the capping layer specified in column 4 is deposited. Example 2 is an unoptimized Mo/Si stack in which a 2 nm native oxide is allowed to grow on a 6 nm Si top layer (compared to the 4 nm top layer of comparative example 1), resulting in a 1% increase in R, a 13% increase in $R^9$peak and a 7% increase in $R^9$int.

In example 3, a 25% gain in $R^9$int is achieved by deposition of a 2 nm B capping layer. Further increases in examples 4 to 7 follow by selecting Rh or Ru as capping layers and optimising the stack. A gain of up to 36% for a two-component (Mo/Si) multilayer stack can be achieved by optimization, as shown by example 7.

Figure 2:
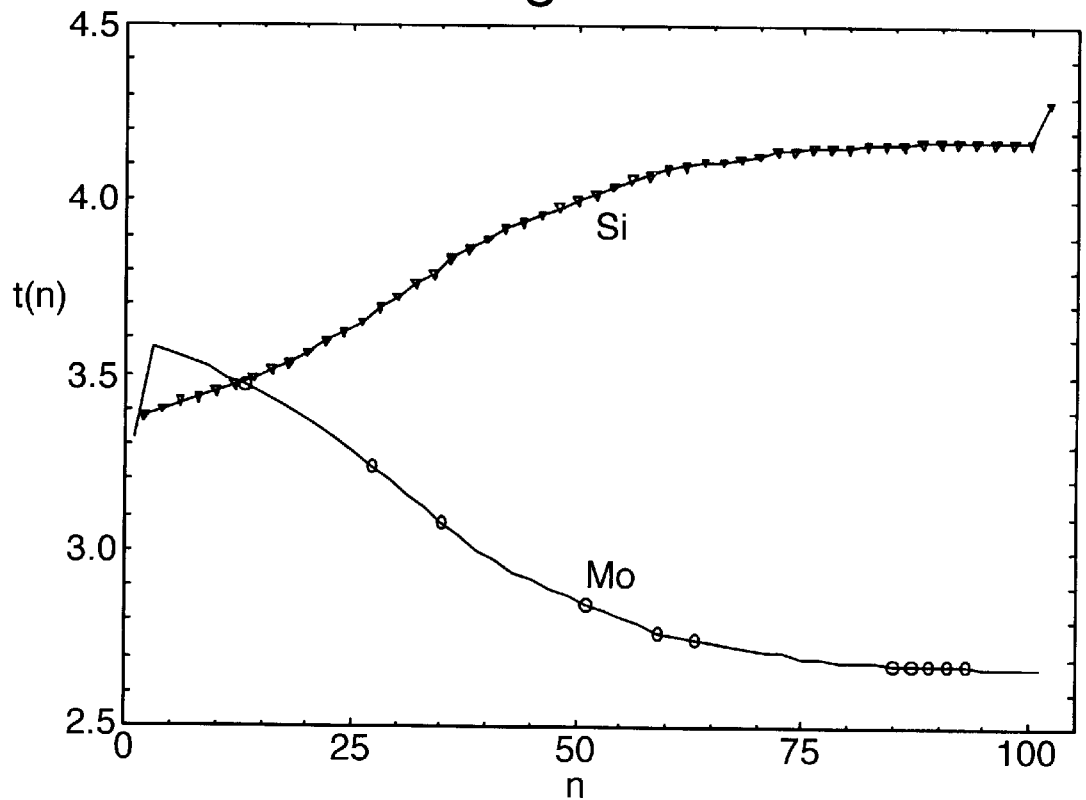
FIG. 2 is a graph of layer thicknesses in a 51 period optimised Mo/Si stack according to the invention.

FIG. 2 shows the layer structure of a 51 period (102 layer) optimised Mo/Si stack with a 1.5 nm capping layer. In the Figure, layer 0 is the substrate surface. As can be seen, the optimization of the Mo/Si stack results in a gradual, smooth variation of the layer thicknesses through the stack while the period width remains nominally constant at about 6.8 to 7.0 nm. Near the substrate, $d_{Mo}$≈$d_{Si}$≈3.5 nm varying to $d_{Mo}$≈2.7 nm and $d_{Si}$≈4.2 nm near the surface. In the stack illustrated in FIG. 2 the partition ratio Γ remains at about 0.4 for the first 20 periods from the surface (one period=one pair of layers, i.e. one Mo layer and one Si layer) and thereafter gradually changes to about 0.5 at the substrate. Thus it appears that the higher the absorption in the material, the lower the thickness near the surface, for an optimum reflectivity response. This phenomenon is discussed further below.

Figure 3:
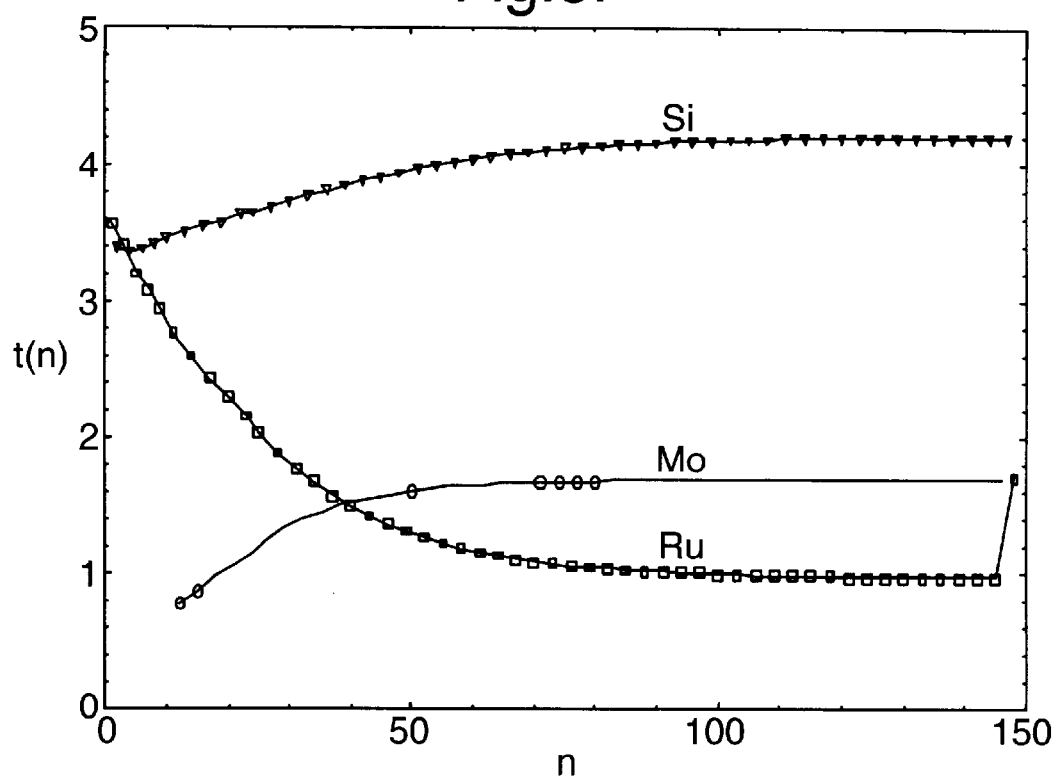
FIG. 3 is graph of layer thicknesses in a 50 period Mo—Ru/Si stack according to the invention.

The three component system of examples 8 to 12 is set up initially as a two-component Mo/Si stack with the third material interleaved between the Mo and Si layers with its initial thickness set to zero. The global optimization process then varies the thicknesses of all the layers until a pre-set reflectivity target is approached. In the case of Mo—Rh/Si and Mo—Ru/Si, Mo is favoured near the surface and Rh or Ru near the substrate whereas, in the Mo—RbCl/Si system, RbCl (which is a single entity) partially substitutes for Si in the center of the stack, i.e. the sum of the thicknesses of the adjacent RbCl and Si layers approaches the thickness of Si in a standard stack. The layer structure for the Mo—Ru/Si stack is shown in FIG. 3. This stack has 50 Si layers, including the uppermost layer, and therefore has 148 layers in total, plus a 1.5 nm Ru capping layer. In the figure, layer 0 is the substrate surface. A 50% gain in computed throughput is observed for the Mo—Ru/Si system over the standard Mo/Si stack.

Figure 4:
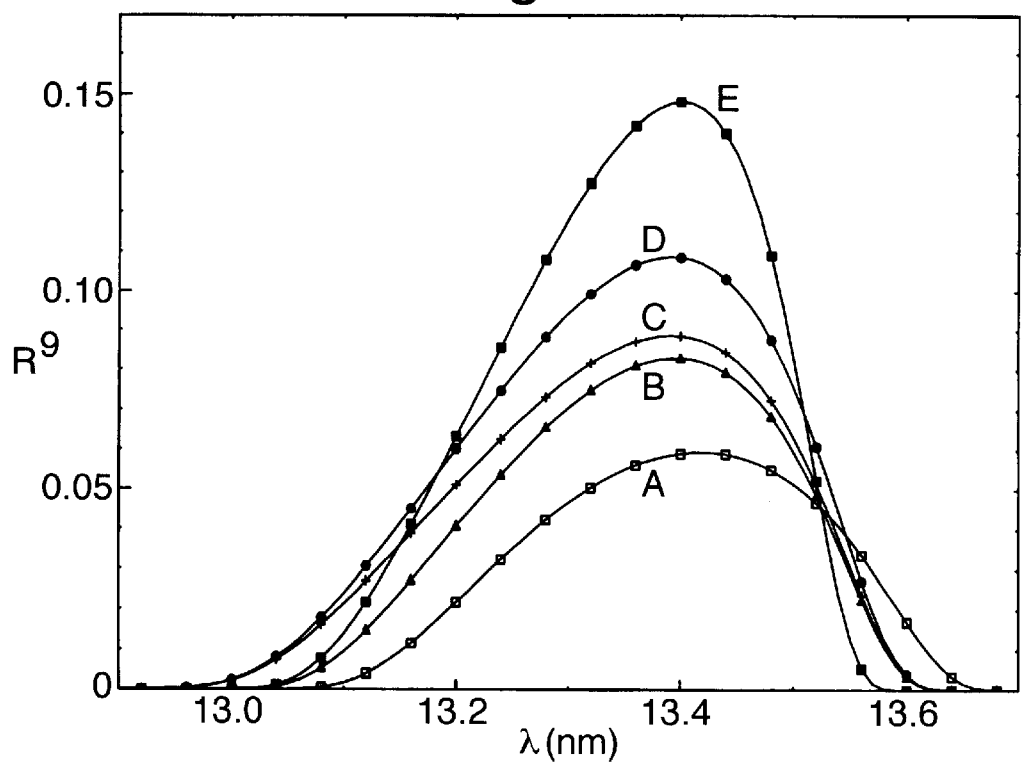
FIG. 4 is a graph of $R^9$ vs. wavelength in the 13.4 nm region for various mirrors embodying the invention and a conventional mirror for comparison.

Example 12 shows a further improvement in $R^9$int for the Mo—Ru/Si system using needle optimization. In the needle optimization routine, additional layers of designated materials, in this case, Mo, Ru and Rh, with vanishingly small thicknesses, are periodically added to the stack. These layers are then allowed to grow or be rejected by a local optimization process. The needle-optimized stack therefore also contains Rh and additional layers of Mo, the net result of which is a 59% increase in $R^9$int compared to the standard stack. It is also worth noting that in this case $R^9$int >$R^9$peak with the peak reflectivity of 0.764 only marginally lower than for the standard optimized Mo—Ru/Si stack. This indicates that a substantially greater spectral half-width results from the needle optimization process as can be seen in FIG. 4, which is a graph showing $R^9$ vs. wavelength in the 13.4 nm region. Line A is for the standard Mo/Si stack, reference example 1; B is optimized Mo/Si, example 4; C is Mo—Ru/Si needle optimized, example 12; D is Mo—Ru—Sr/Si needle optimized, example 19, and E is Mo/Rb optimized, example 22.

Figure 5:
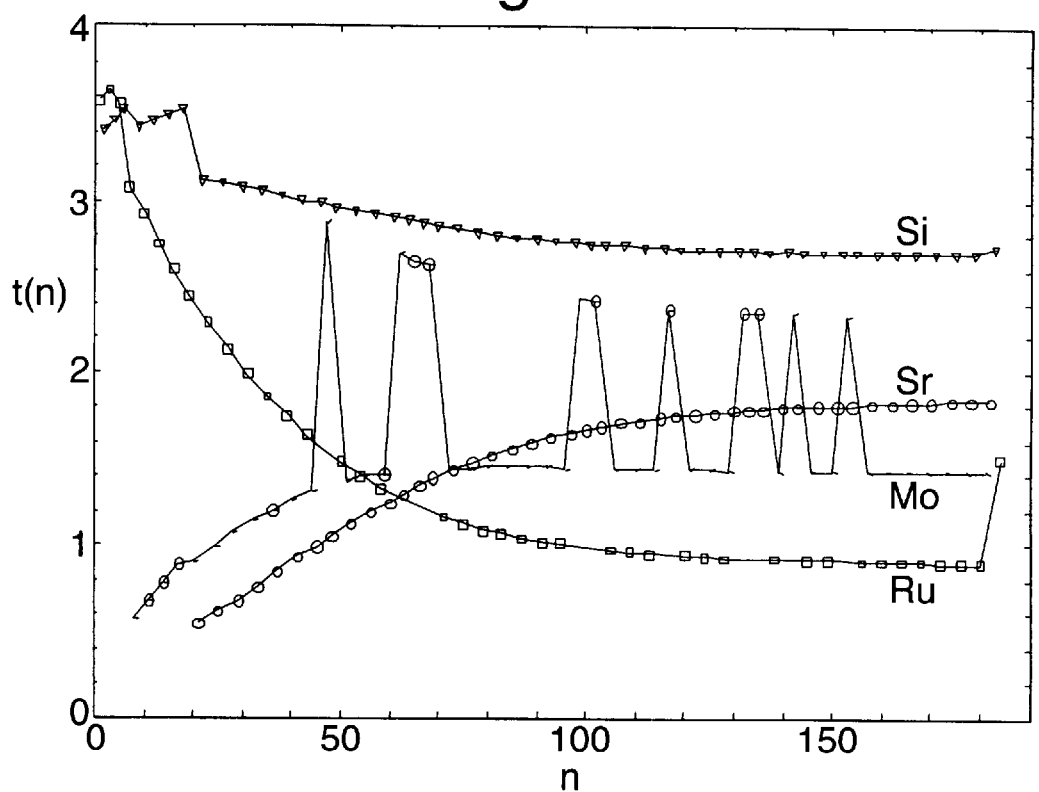
FIG. 5 is a graph of layer thicknesses in a 50 period Mo—Ru—Sr/Si stack according to the invention.

The order of layers in the three component stacks may be varied. For example, Rh—Mo/Si may be used instead of Mo—Rh/Si and Ru—Mo/Si instead of Mo—Ru/Si The four-component stacks, examples 13 to 20, were built in a similar manner to the three component stacks described above. The most favorable combination is Mo—Ru—Sr/Si with up to an 88% relative increase in output intensity. FIG. 5 shows the layer thicknesses (nm) of a 50 period Mo—Ru—Sr/Si stack with a Ru capping layer. As before, layer 0 indicates the substrate surface. Again, within the first 50 layers from the 10 substrate Ru predominates over Mo. The spikes in the Mo layer thickness profile indicate layers where the Ru layer has been wholly replaced by Mo as suggested by the numerical optimization technique. This is not essential to the gain in $R^9$int and the relevant Mo layers can be replaced by pairs of Mo and Ru layers. Sr performs a similar function to Si in the stack as it has a high value of n and a low extinction coefficient, k, (see Table 1). The low absorption within the Sr layers makes it preferable in the top half of the stack. As with the Mo—Ru/Si example discussed above, the sums of the thicknesses of Si and Sr and Ru and Mo approximate respectively to the optimized Si and Mo thicknesses shown in FIG. 2. The preferred order of the elements is: Ru—Mo—Sr—Si. The grouping of layers may also be varied, e.g. Ru—Mo—Sr/Si may be regarded as Ru—Mo/Sr—Si for calculation purposes.

Figure 6:
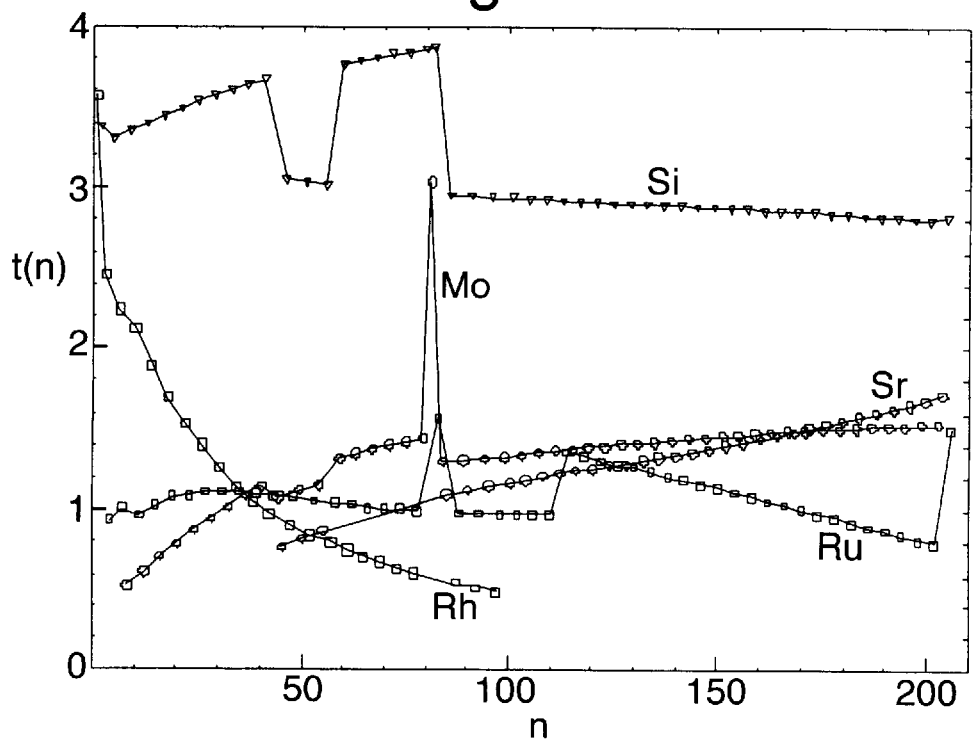
FIG. 6 is a graph of layer thicknesses in a needle optimised 50 period Mo—Ru—Sr/Si stack according to the invention.

FIG. 6 shows the layer thicknesses of a needle-optimized 50 period (50 Si layers) Mo—Ru—Sr/Si stack. Rh is included only in the lower half of the stack and predominantly in the first 40 layers. In the lowest layers Rh is preferred over Ru because of its higher optical contrast with Si, in spite of its higher extinction coefficient.

Sr and Y are less easily depositable owing to the complex chemistry of Y and the high reactivity of Sr, so are less preferred, but still show advantages over the conventional stack. Mo—Ru—Zr/Si and Mo—Ru—RbCl/Si show particular promise, as do the same layers in the order Ru—Mo—Zr/Si and Ru—Mo—RbCl/Si.

A comparison of the optical constants of Rb and Si (Table 1) indicates that Rb is in principle a more optimal material as a spacer layer. With a value of n at 13.4 nm similar to that of Si (close to unity), Rb would maintain the optical contrast with e.g. Mo and Ru. In addition, the lower value of the extinction coefficient k compared to that of Si, makes Rb a near optimal spacer material. This is borne out by examples 21 to 23 as can be seen from Table 2. An increase in the peak reflectivity of 5% is found for the Mo/Rb stack as compared to the equivalent Mo/Si stack yielding a value of $R^9$int which is more than a factor 2 higher than the standard Mo/Si stack. However, Rb-based systems present constructional and operational difficulties due to the high reactivity and extremely low melting point (39° C.) of Rb.

Reference Example 24

Reference example 24 is a multilayer stack for use at 11.3 nm comprising an unoptimized 80-period Mo/Be system grown on a Zerodur (RTM) glass substrate, with a partition ratio $\Gamma$=0.4 yielding $d_{Mo}$=2.3 nm and $d_{Be}$=3.4 nm. This provides the reference for examples 25 to 40 which are tuned for use at 11.3 nm.

Examples 25 to 40

Table 3 corresponds to Table 2 but gives data for examples 25 to 40 according to the invention which are reflector stacks tuned for use at 11.3 nm.

The effects of optimization and the capping layer deposition are less important at 11.3 nm than at 13.4 nm, only 8% improvement in $R^9$int is provided.

However, Ru and Rh are preferred to Mo for the 11.3 nm window. The Ru/Be stack has a relative optical throughput greater by up to 70% compared to the Mo/Be reference example, whilst the throughput of the Rh/Be stack is 33% greater. Although this is significantly lower than for Ru/Be, this combination may be preferable in some applications of the invention due to factors such as Rh—Be interface chemistry.

A particularly preferred embodiment of the invention is the "needle" optimized Rh/Be stack which exhibits a huge increase in reflectivity. This is due to the incorporation of Pd, Ru and Mo layers during the optimization process effectively transforming it into a Rh—Ru—Pd—Mo/Be or Pd—Rh—Ru—Mo/Be multi-component stack.

Figure 7:
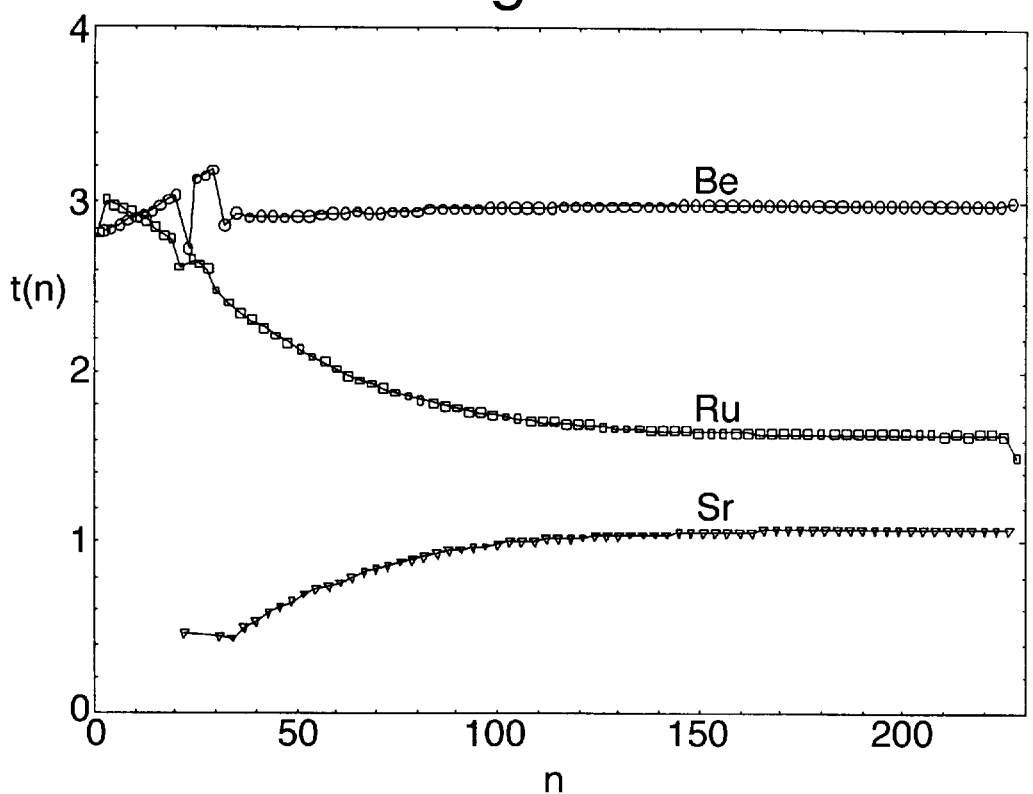
FIG. 7 is a graph of layer thicknesses in an 80 period Ru—Sr/Be stack according to the invention.

The layer thicknesses of an 80 period (80 Be layers) Ru—Sr/Be stack capped with a 1.5 nm Ru layer are shown in FIG. 7. Similar results may be achieved with Ru/Sr—Be. As before, the substrate surface is indicated at layer 0. Due to their similar optical constants, Be and Sr perform similar functions in the stack with Ru predominating near the substrate. The sum of the Be and Sr thicknesses near the surface is about 4.1 nm while the Ru thickness is about 1.7 nm. These are markedly different than the thicknesses of the Mo/Be stack with $\Gamma$=0.4. This is because of the higher extinction coefficient of Ru, as compared to Mo, such that a lower Ru thickness is preferred. The gain in employing Ru in place of Mo derives from the resultant increase in optical contrast with Be. The preferred stack period is: Ru—Sr—Be.

Figure 8:
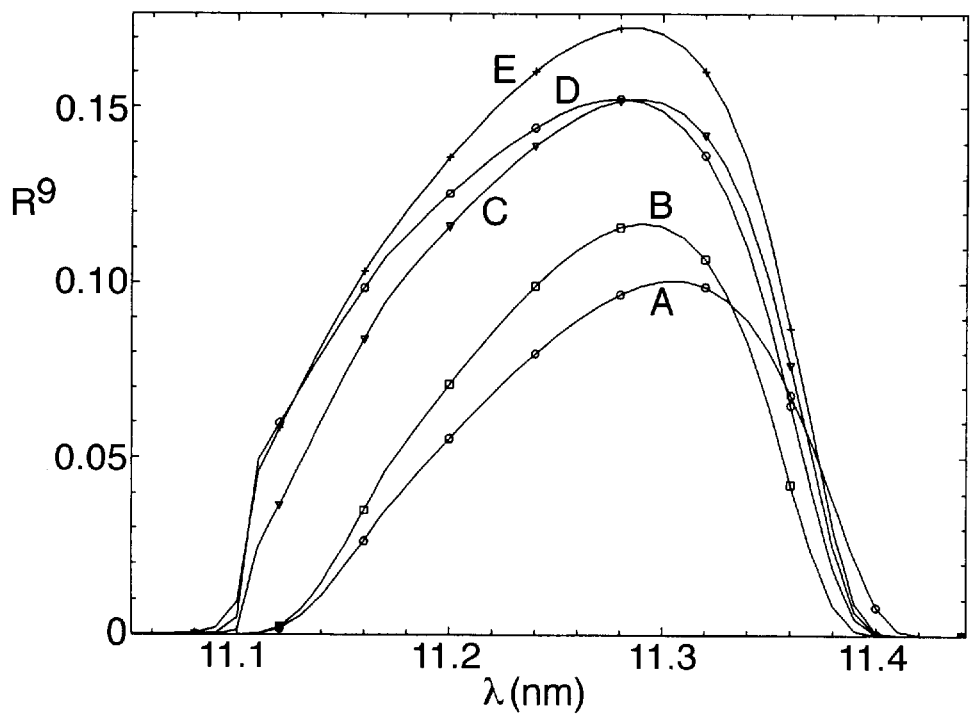
FIG. 8 is a graph of $R^9$ vs. wavelength in the 11.3 nm region for various mirrors embodying the invention and a conventional mirror for comparison.

Selected spectra of Be-based multilayers are shown in FIG. 8. This Figure shows plots of $R^9$ vs. wavelength in the 11.3 nm region for five stacks. A is the reference Mo/Be stack, B is an optimized Mo/Be stack with a Ru capping layer, C is an optimized Ru/Be stack, D is a needle optimized Rh/Be stack and E is an optimised, Ru—capped Ru—Sr/Be stack.

Examples 35 to 40 are strontium-containing three component systems which yield throughput enhancements of up to a factor of 2.

As capping layers, Rh and Ru are optimum for this wavelength region and give an increase of 0.7–1.0% in R.

Examples 41 to 44

From the above computational analysis of the various multilayer systems for the EUV region between 11 nm and 14 nm it would appear that significant enhancements in peak reflectivities and the integrated reflectivities for a 9-mirror optical system are possible. A combination of capping layer choice, global and needle optimization routines and, most importantly, the incorporation of additional or replacement materials within the stack appears to be the recipe for reflectivity enhancement. Metals such as Rh and Ru which are generally easily deposited using various vacuum deposition techniques provide advantages, especially in conjunction with Be for the 11.3 nm region where they surpass Mo in theoretical performance. Furthermore, it is conceivable that using the various combinations discussed above, problems of interface roughness associated with Mo/Si(Be) may be alleviated somewhat.

In for instance the Mo—Rh/Si and Mo—Ru/Si stacks, improved results are provided with Rh (Ru) predominating over Mo near the substrate and vice-versa near the surface. This may be because at 13.4 nm Rh and Ru exhibit a higher optical contrast with Si than does Mo whereas the extinction coefficient k, and therefore the absorption within the layer, is lower for Mo than Rh and Ru. Near the surface of the stack, it is important that there be low absorption so that the incident radiation penetrates as deep into the stack as possible so that the phasor addition is maximised. However, deep within the stack where the intensity is low, increased optical contrast is favored for the reflected intensity to be maximized.

When Sr is incorporated in the structure it is preferentially located in the near-surface region of the stack and partially substitutes Si. This can be explained by similar arguments, the value of n for Sr is lower than that of Si and therefore while the optical contrast with the low-n materials is slightly lowered, the lower value of k for Sr compared with Si (see Table 1) means that the absorption within the layer is lower thus favouring Sr near the surface of the stack. The data obtained for Be-based stacks for 11.3 nm operation indicates that similar effects occur.

Examples 41 to 44 are designed for use with a Xenon-jet laser-induced plasma source (Xe-Jet LPS) which has a peak output intensity at about 10.9 nm, somewhat lower than the range for which the reflectors described above were designed.

Figure 9:
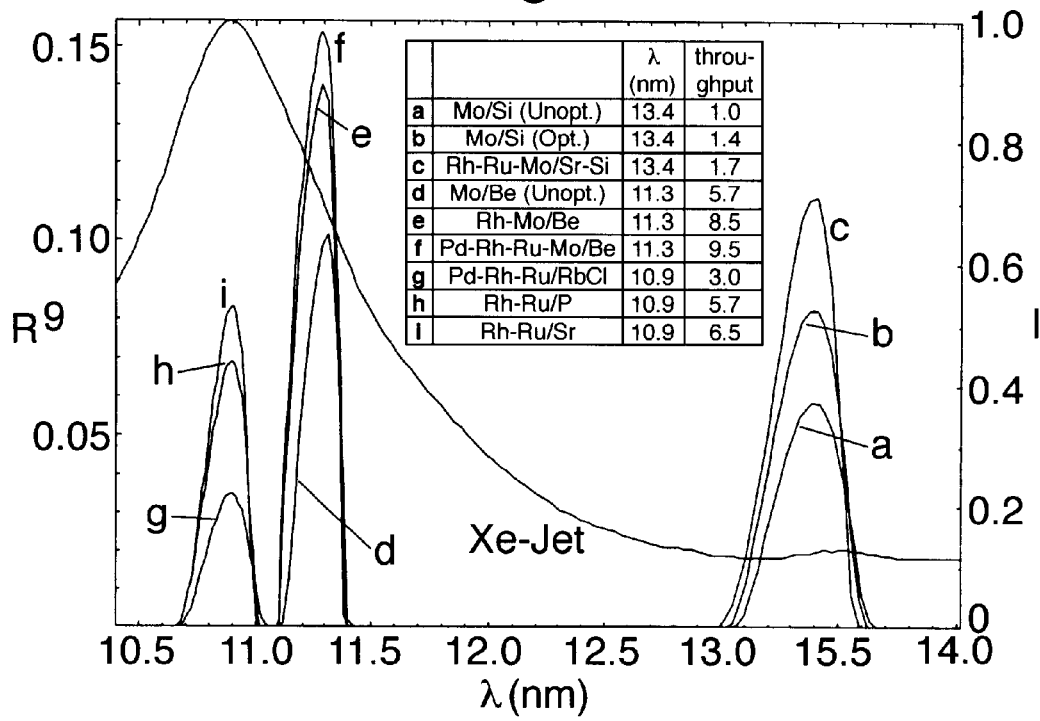
FIG. 9 is a graph showing $R^9$ vs. wavelength for various stacks, both conventional and according to the invention as well as the emission intensity of a Xe-jet laser-induced plasma source.

FIG. 9 shows the $R^9$ reflectivities (left axis) of various reflectors and the relative Xe-Jet LPS emission intensity (right axis) vs. wavelength in nm (X axis). In FIG. 9:

(a) is the spectral response of the conventional unoptimized Mo/Si stack and is used as the reference for relative reflectivity figures.

(b) is an optimized Mo/Si stack similar to example 7 above;

(c) is an optimized Rh—Ru—Mo/Sr—Si stack;

(d) is a conventional, unoptimized, Mo/Be stack similar to comparative example 24 above;

(e) is an optimized Rh—Mo/Be stock similar to example 40 above;

(f) is an optimized Pd—Rh—Ru—Mo/Be stack;

(g) is an optimized Pd—Rh—Ru/RbCl stack forming example 41 of the invention;

(h) is an optimized Rh—Ru/P stack forming example 42 of the invention; and (i) is an optimized Rh—Ru/Sr stack forming example 43 of the invention.

Although examples 41 to 43 have lower $R^9$ peak and $R^9$int than other examples described above, they have the advantage of providing their peak reflectivity very close to the emission maximum of the Xe-Jet LPS. They are thus ideal for use with this source. Taking the throughput of the unoptimized Mo/Si stack as 1.0, examples 41(g), 42(h) and 43(i) provide relative throughputs of 3.0, 5.7, and 6.5 respectively. This also compares well with the throughput of the Mo/Be stack (d), which is 5.7 and avoids the use of Be, which is highly toxic.

Further improvements in peak reflectivity, giving values greater than 0.75 in the 9.0 to 12 nm region can be attained in four component stacks that combine P and Sr, e.g. Rh—Ru/P—Sr.

Figure 10:
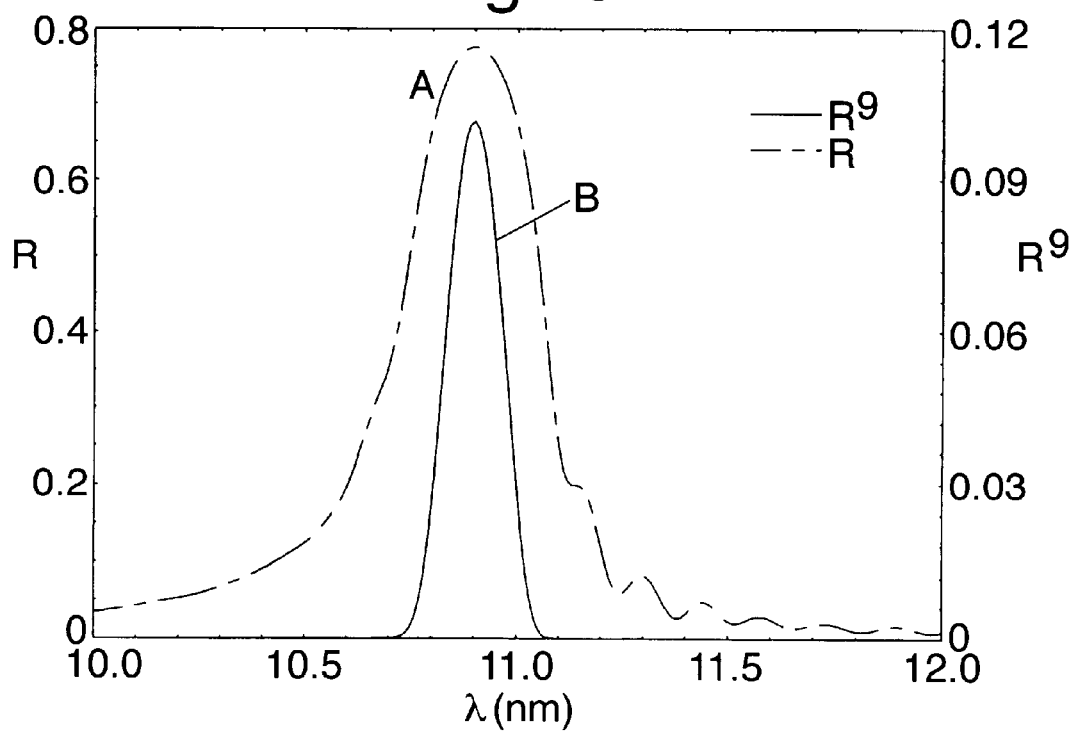
FIG. 10 is a graph showing R and $R^9$ vs. wavelength for a Rh—Ru/Sr—Ce stack according to the invention.
Figure 11:
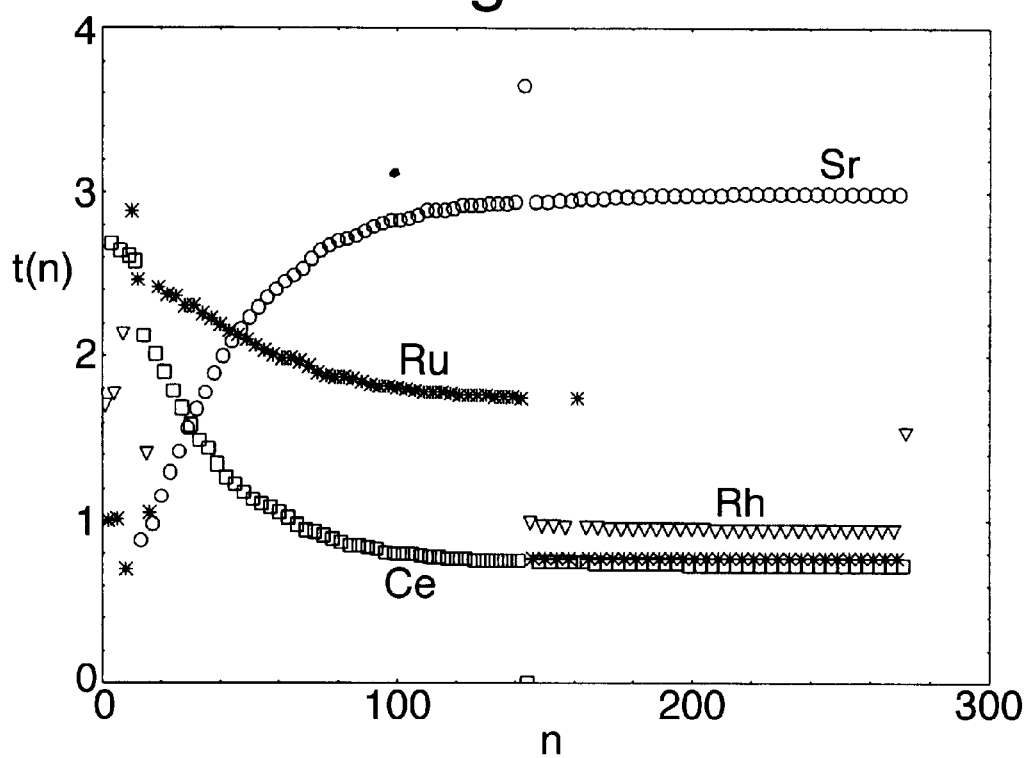
FIG. 11 is a graph of layer thicknesses in an optimised Rh—Ru/Sr—Ce stack according to the invention.

A further advance is shown by example 44. Example 44 is a needle optimized Rh—Ru/Sr—Ce stack with a peak reflectivity of R=0.776 at 10.9 nm. FIG. 10 shows the full wavelength dependence of R (left axis) and $R^9$ (right axis) of example 44 in the 10 to 12 nm range. FIG. 11 shows layer thicknesses in this stack.

Examples 45 to 48

Some further alternative stack configurations are shown in Table 4. In this table, Example 45 is a three layer stack of Ru—Nb/Si, which demonstrates that Niobium can also give improvements in an Si-based stack, but is otherwise the same as the examples 8 to 12 of Table 2.

For use at 12.8 nm, different multilayers may be optimal. Two such multilayers are example 47 and 48 of Table 4. At 46, the R value of a conventional Mo/Si (equivalent to Comparative Example 1) at 12.8 nm is given. It can readily be seen that the addition of Ru partially replacing Mo improves reflectivity at this frequency while the use of beryllium as a spacer material partially replacing silicon provides further improvements.

In general, the lanthanides (rare earth metals) may provide good optical contrast with metals such as Mo, Ru and Rh and may be preferred in reflectors nearer the substrate. In this position, optical contrast is provided because the lanthanides have a refractive index n very close to unity which outweighs the disadvantage that their values of extinction coefficient k are not as low as some other materials in the 9–16 nm region. Lanthanum is particularly preferred at or near 13 nm.

Figure 12:
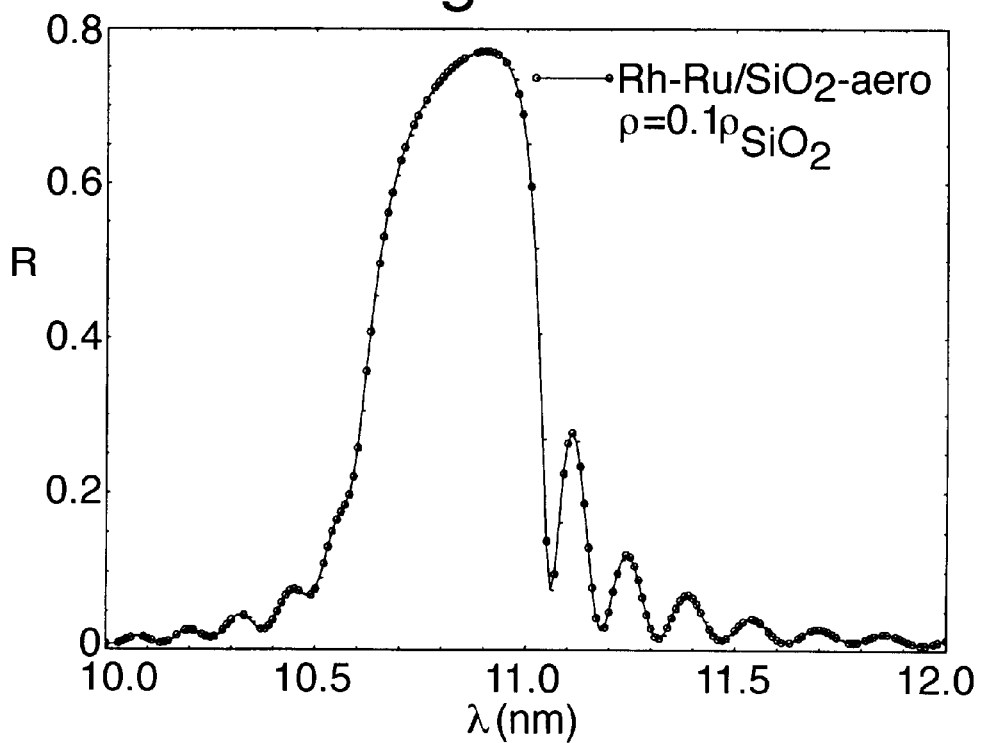
FIG. 12 is a graph showing R versus wavelength for a Rh—Ru/SiO$_2$-aero stack according to the invention.

Further alternative spacers useable in the invention are porous materials such as low density (porous) silica (aerogel) having a density about 1 tenth that of bulk silica. FIG. 12 shows the wavelength sensitivity of a Rh—Ru/SiO$_2$-aero stack using such porous silica. Its relatively broad reflectance peak below 11 nm will be noted. Other low density materials that may be used include: titania and alumina aerogels; nano-porous silicon, meso-porous silicon, nanoclusters of silicon and other semiconductors. These materials may be used to manufacture reflectors tuned to specific wavelengths throughout the 8 to 20 nm wavelength range. The materials are useful because the values on n and k are density dependent. With decreasing density the refractive index, n, tends to unity and the extinction coefficient, k, tends to zero. The density of a typical Si aerogel is 0.2 gcm$^{-3}$ while that of porous Si is 1.63 gcm$^{-3}$.

Further details of capping layers which may be applied to reflectors according to the present invention are described in a copending application entitled "Capping Layer for EUV Optical Elements" (applicant's reference P-0150.030) which is incorporated herein by reference.

While we have described above specific embodiments of the invention it will be appreciated that the invention may be practiced otherwise than as described. The description is not intended to limit the invention.

TABLE 1

| | 10.9 nm | | 11.3 nm | | 13.4 nm | |
|---|---|---|---|---|---|---|
| | n | k | n | k | n | k |
| B | | | 0.9786 | 0.0023 | 0.9689 | 0.0040 |
| B₄C | | | 0.9753 | 0.0029 | 0.9643 | 0.0050 |
| Be | 1.0092 | 0.0196 | 1.0081 | 0.0010 | 0.9892 | 0.0018 |
| BeO | | | 0.9785 | 0.0102 | 0.9587 | 0.0171 |
| BN | | | 0.9740 | 0.0050 | 0.9633 | 0.0086 |
| C | | | 0.9732 | 0.0040 | 0.9622 | 0.0067 |
| Ce | 1.0522 | 0.0197 | 1.0380 | 0.0159 | 1.0074 | 0.0062 |
| Eu | 0.9902 | 0.0062 | 0.9883 | 0.0074 | 0.9812 | 0.0123 |
| La | 1.0777 | 0.0601 | 1.0460 | 0.0200 | 1.0050 | 0.0065 |
| Mo | | | 0.9514 | 0.0046 | 0.9227 | 0.0062 |
| P | 0.9949 | 0.0014 | | | | |
| Pd | 0.9277 | 0.0099 | 0.9198 | 0.0135 | 0.8780 | 0.0443 |
| Pr | 1.0167 | 0.0119 | 1.0115 | 0.0125 | 0.9840 | 0.0072 |
| Rb | | | 0.9974 | 0.0014 | 0.9941 | 0.0007 |
| RbCl | 0.9943 | 0.0023 | 0.9941 | 0.0022 | 0.9895 | 0.0019 |
| Rh | 0.9313 | 0.0068 | 0.9236 | 0.0089 | 0.8775 | 0.0296 |
| Ru | 0.9373 | 0.0056 | 0.9308 | 0.0063 | 0.8898 | 0.0165 |
| Si | | | 1.0055 | 0.0146 | 0.9999 | 0.0018 |
| Si aerogel | 0.9988 | 0.0011 | | | | |
| Porous Si | 1.0015 | 0.0049 | | | | |
| Si₃N₄ | | | 0.9864 | 0.0173 | 0.9741 | 0.0092 |
| SiC | | | 0.9936 | 0.0159 | 0.9831 | 0.0047 |
| SiO₂ | | | 0.9865 | 0.0123 | 0.9787 | 0.0106 |
| Sr | 0.9936 | 0.0011 | 0.9928 | 0.0011 | 0.9880 | 0.0013 |
| Y | | | 0.9835 | 0.0020 | 0.9742 | 0.0023 |
| Zr | | | 0.9733 | 0.0029 | 0.9585 | 0.0037 |

TABLE 2

| | | | | R | $R^9$ peak | $R^9$ int |
|---|---|---|---|---|---|---|
| 1 | Mo/Si | N | 2 nm SiO₂ | 0.731 | 1.00 | 1.00 |
| 2 | Mo/Si | N | (2 nm Si +) 2 nm SiO₂ | 0.741 | 1.13 | 1.07 |
| 3 | Mo/Si | N | 2 nm B | 0.751 | 1.27 | 1.25 |
| 4 | Mo/Si | Y | 2 nm B | 0.752 | 1.29 | 1.26 |
| 5 | Mo/Si | Y | 1.5 nm Rh | 0.754 | 1.32 | 1.27 |
| 6 | Mo/Si | N | 1.5 nm Ru | 0.757 | 1.37 | 1.35 |
| 7 | Mo/Si | Y | 1.7 nm Ru | 0.758 | 1.39 | 1.36 |
| 8 | Mo-Rh/Si | Y | 1.7 nm Ru | 0.762 | 1.45 | 1.38 |
| 9 | Mo-RbCl/Si | Y | 1.5 nm Ru | 0.761 | 1.44 | 1.39 |
| 10 | Mo-Ru/Si | Y | 1.5 nm Rh | 0.760 | 1.42 | 1.41 |
| 11 | Mo-Ru/Si | Y | 1.7 nm Ru | 0.765 | 1.51 | 1.50 |
| 12 | Mo-Ru/Si | Y(n) | 1.5 nm Ru | 0.764 | 1.48 | 1.59 |
| 13 | Mo-Rh-RbCl/Si | Y | 1.7 nm Ru | 0.764 | 1.49 | 1.38 |
| 14 | Mo-Ru-Zr/Si | Y | 1.7 nm Ru | 0.764 | 1.49 | 1.44 |
| 15 | Mo-Ru-Y/Si | Y | 1.5 nm Ru | 0.770 | 1.60 | 1.55 |
| 16 | Mo-Ru-RbCl/Si | Y | 1.5 nm Ru | 0.767 | 1.54 | 1.56 |
| 17 | Mo-Rh-Sr/Si | Y | 1.6 nm Ru | 0.779 | 1.77 | 1.56 |
| 18 | Mo-Ru-Sr/Si | Y | 1.5 nm Rh | 0.776 | 1.71 | 1.57 |
| 19 | Mo-Ru-Sr/Si | Y | 1.5 nm Ru | 0.791 | 1.81 | 1.68 |
| 20 | Mo-Ru-Sr/Si | Y(n) | 1.5 nm Ru | 0.781 | 1.81 | 1.85 |
| 21 | Ru/Rb | Y | 1.5 nm Ru | 0.779 | 1.77 | 1.41 |
| 22 | Mo/Rb | Y | 1.5 nm Ru | 0.809 | 2.49 | 2.13 |
| 23 | Mo-Ru-Sr/Rb | Y | 1.5 nm Ru | 0.814 | 2.63 | 2.20 |

TABLE 3

| | | | | R | $R^9$ peak | $R^9$ int |
|---|---|---|---|---|---|---|
| 24 | Mo/Be | N | None | 0.775 | 1.00 | 1.00 |
| 25 | Mo/Be | N | 1.5 nm Rh | 0.782 | 1.08 | 1.08 |
| 26 | Mo/Be | Y | None | 0.780 | 1.06 | 1.00 |
| 27 | Mo/Be | Y | 1.5 nm Rh | 0.787 | 1.15 | 1.06 |
| 28 | Mo/Be | Y | 1.5 nm Ru | 0.788 | 1.16 | 1.08 |
| 29 | Ru/Be | Y | 1.5 nm Rh | 0.810 | 1.49 | 1.68 |
| 30 | Ru/Be | Y | 1.5 nm Ru | 0.811 | 1.50 | 1.70 |
| 31 | Rh/Be | N | 1.5 nm Rh | 0.793 | 1.10 | 1.33 |
| 32 | Rh/Be | Y | 1.5 nm Rh | 0.793 | 1.23 | 1.29 |
| 33 | Rh/Be | Y | 1.5 nm Ru | 0.794 | 1.24 | 1.31 |
| 34 | Rh/Be | Y(n) | 1.5 nm Ru | 0.811 | 1.50 | 1.77 |
| 35 | Mo-Sr/Be | Y | 1.5 nm Rh | 0.799 | 1.32 | 1.21 |
| 36 | Ru-Sr/Be | Y | 1.5 nm Rh | 0.822 | 1.70 | 1.97 |
| 37 | Ru-Sr/Be | Y | 1.5 nm Ru | 0.823 | 1.72 | 2.00 |
| 38 | Rh-Sr/Be | Y | 1.5 nm Rh | 0.810 | 1.49 | 1.64 |
| 39 | Rh-Sr/Be | Y | 1.5 nm Ru | 0.811 | 1.50 | 1.67 |
| 40 | Ru-Mo/Be | Y(n) | 1.5 nm Ru | 0.812 | 1.52 | 1.72 |

TABLE 4

| | | | | R | $R^9$ peak | $R^9$ int |
|---|---|---|---|---|---|---|
| 45 | Ru-Nb/Si | Y | 2 nm Rh | 0.754 | 1.20 | 1.27 |
| 46 | Mo/Si | N | 2 nm Si + 2 nm SiO₂ | 0.738 | 1.00 | 1.00 |
| 47 | Ru-Mo/Si | Y | 2 nm Rh | 0.768 | 1.43 | 1.48 |
| 48 | Ru-Mo/Be-Si | Y | 2 nm Rh | 0.778 | 1.61 | 1.63 |

What is claimed is:

1. A reflector constructed and arranged to reflect radiation in a desired wavelength range, the reflector comprising:
a stack of alternating layers of a first and a second material, said first material having a lower real refractive index in said desired wavelength range than said second material; and
at least one layer of a third material different from the first and second materials and interposed in said stack, said third material being selected from the group comprising Rb, RbCl, RbBr, Sr, Y, Zr, Ru, Rh, Tc, Pd, Nb, Be and alloys and compounds thereof; wherein
said reflector provides for a peak reflectivity in the range of from about 8 to about 20 nm; and
wherein a layer of said third material is interposed between each pair of layers of said first and second materials.

2. A reflector constructed and arranged to reflect radiation in a desired wavelength range, the reflector comprising:
a stack of alternating layers of a first and a second material, said first material having a lower real refractive index in said desired wavelength range than said second material; and
at least one layer of a third material different from the first and second materials and interposed in said stack, said third material being selected from the group comprising Rb, RbCl, RbBr, Sr, Y, Zr, Ru, Rh, Tc, Pd, Nb, Be and alloys and compounds thereof; and
at least one layer of a fourth material different from said first, second and third materials and interposed in said stack, said fourth material being selected from the group comprising Rb, RbCl, RbBr, Sr, Y, Zr, Ru, Rh, Tc, Pd, Nb, Be and alloys and compounds thereof.

3. A reflector as in claim 3 wherein the thickness of the layers is selected to provide a substantially constant period width in the stack.

4. A reflector constructed and arranged to reflect radiation in a desired wavelength range, the reflector comprising:

a stack of alternating layers of a first and a second material, said first material having a lower real refractive index in said desired wavelength range than said second material; and at least one layer of a third material different from the first and second materials and interposed in said stack, said third material being selected from the group comprising Rb, RbCl, RbBr, Sr, Y, Zr, Ru, Rh, Tc, Pd, Nb, Be and alloys and compounds thereof; wherein said first material is selected from the group comprising: Mo, Ru and Rh; and said second material is selected from the group comprising: Si, Be, P, Sr, Rb or RbCl.

5. A reflector as in claim 4 wherein the thickness of the layers is selected to provide a substantially constant period width in the stack.

6. A reflector constructed and arranged to reflect radiation in a desired wavelength range, the reflector comprising:

a stack of alternating layers of a first and a second material, said first material having a lower real refractive index in said desired wavelength range than said second material, wherein layer thicknesses of said first and second materials vary through the stack and adjacent pairs of layers of first and second materials together have substantially constant thickness; and wherein said reflector provides for a peak reflectivity in the range of from about 8 to about 20 nm.

7. A reflector constructed and arranged to reflect radiation in a desired wavelength range, the reflector comprising:

a stack of alternating layers of a first and a second material, said first material having a lower real refractive index in said desired wavelength range than said second material, wherein layer thicknesses of said first and second materials vary through the stack and adjacent pairs of layers of first and second materials together have substantially constant thickness; wherein layers of said first material near an incident surface of said reflector are thinner than layers of the first material further from the incident surface.

8. A reflector constructed and arranged to reflect radiation in a desired wavelength range, the reflector comprising:

a stack of alternating layers of a first and a second material, said first material having a lower real refractive index in said desired wavelength range than said second material, wherein layer thicknesses of said first and second materials vary through the stack and adjacent pairs of layers of first and second materials together have substantially constant thickness; and wherein layers of said second material close to an incident surface of said reflector are thicker than layers of the second material further from the incident surface.

9. A reflector constructed and arranged to reflect radiation in a desired wavelength range, the reflector comprising:

a stack of alternating layers of a first and a second material, said first material having a lower real refractive index in said desired wavelength range than said second material, said second material is selected from the group comprising P, Sr, Rb, lanthanides, and compounds and alloys thereof, and wherein said reflector provides for a reflectivity peak in the range from about 8 to about 20 nm.

10. A reflector according to claim 9 wherein said first material is selected from the group comprising Ru, Mo, and Ru and compounds and alloys thereof.

11. A reflector constructed and arranged to reflect in a desired wavelength range, the reflector comprising:

a stack of alternating layers of a first and a second material, said first material having a lower real refractive index in said desired wavelength range than said second material, said first material is selected from the group comprising Ru and Rh and alloys and compounds thereof; and at least one layer of a third material different from the first and the second materials, said third material being selected from the group comprising Sr, Mo and compounds and alloys thereof.

12. A reflector according to claim 11 wherein said second material is Be or an alloy or a compound thereof.

13. A reflector constructed and arranged to reflect radiation in a desired wavelength range, the reflector comprising:

a stack of alternating layers of a first and a second material, said first material having a lower real refractive index in said desired wavelength range than said second material; and at least one layer of a third material different from the first and second materials and interposed in said stack, said third material being selected from the group comprising Rb, RbCl, RbBr, Sr, Y, Zr, Ru, Rh, Tc, Pd, Nb, Be and alloys and compounds thereof; and a capping layer of a relatively inert material compared to said second and third layers.

14. A reflector according to claim 13 wherein said relatively inert material is selected from the group comprising: diamond-like carbon (C), boron nitride (BN), silicon nitride ($Si_3N_4$), silicon carbide (SiC), B, $Ru_1$ Rh and compounds and alloys thereof.

15. A reflector according to claim 13 wherein said capping has a thickness in the range of from about 0.5 to about 3 nm.

16. A reflector according to claim 15 wherein each thickness is between about 1 to 2 nm.

17. A reflector constructed and arranged to reflect radiation in a desired wavelength range, the reflector comprising:

a stack of alternating layers of a first and a second material, said first material having a lower real refractive index in said desired wavelength range than said second material; and at least one layer of a third material different from the first and second materials and interposed in said stack, said third material being selected from the group comprising Rb, RbCl, RbBr, Sr, Y, Zr, Ru, Rh, Tc, Pd, Nb, Be and alloys and compounds thereof; wherein said reflector provides for a peak reflectivity in the range of from about 8 to about 20 nm.

18. A reflector according to claim 17 wherein said range is from about 9 to about 16 nm.

19. A reflector constructed and arranged to reflect radiation in a desired wavelength range, the reflector comprising:

a stack of alternating layers of a first and a second material, said first material having a lower real refractive index in said desired wavelength range than said second material; and at least one layer of a third material different from the first and second materials and interposed in said stack, said third material being selected from the group comprising Rb, RbCl, RbBr, Sr, Y, Zr, Ru, Rh, Tc, Pd, Nb, Be and alloys and compounds thereof; wherein said reflector provides for a peak reflectivity in the range of from about 8 to about 20 nm; and wherein said second material is a low density porous material selected from the group of silica, titania and alumina aerogels, nano-porous silicon, nanoclusters of silicon, and semiconductors.

20. A lithographic projection apparatus comprising:

an illumination system constructed and arranged to supply a projection beam of radiation;

a first object table provided with a mask holder constructed and arranged to hold a mask;

a second object table provided with a substrate holder constructed and arranged to hold a substrate; and a projection system constructed and arranged to image an irradiated portion of the mask onto a target portion of the substrate, at least one of said illumination system and said projection system including a reflector constructed and arranged to reflect radiation in a desired wavelength range, said reflector comprising:
  (a) a stack of alternating layers of a first and a second material, said first material having a lower real refractive index in said desired wavelength range than said second material; and
  (b) at least one layer of a third material interposed in said stack, said third material being selected from the group comprising Rb, RbCl, RbBr, Sr, Y, Zr, Ru, Rh, Tc, Pd, Nb, Be and alloys and compounds thereof.

21. A reflector constructed and arranged to reflect radiation in a desired wavelength range, the reflector comprising:

a stack of alternating layers of a first and a second material, said first material having a lower real refractive index in said desired wavelength range than said second material; and at least one layer of a third material different from the first and second materials and interposed in said stack, said third material being selected from the group comprising Rb, RbCl, RbBr, Sr, Y, Zr, Ru, Rh, Tc, Pd, Nb, Be and alloys and compounds thereof; wherein the thickness of the layers is selected to provide a substantially constant period width.

22. A reflector constructed and arranged to reflect radiation in a desired wavelength range, the reflector comprising:

a stack of alternating layers of a first and a second material, said first material having a lower real refractive index in said desired wavelength range than said second material; and at least one layer of a third material different from the first and second materials and interposed in said stack, said third material being selected from the group comprising Rb, RbCl, RbBr, Sr, Y, Zr, Ru, Rh, Tc, Pd, Nb, Be and alloys and compounds thereof; wherein a layer of said third material is interposed between each pair of layers of said first and second materials; and wherein the thickness of the layers is selected to provide a substantially constant period width.

* * * * *